(12) United States Patent
Lin et al.

(10) Patent No.: US 10,727,085 B2
(45) Date of Patent: Jul. 28, 2020

(54) PRINTED ADHESION DEPOSITION TO MITIGATE INTEGRATED CIRCUIT PACKAGE DELAMINATION

(71) Applicant: TEXAS INSTRUMENTS INCORPORATED, Dallas, TX (US)

(72) Inventors: Yong Lin, Plano, TX (US); Rongwei Zhang, Dallas, TX (US); Benjamin Stassen Cook, Rockwall, TX (US); Abram Castro, Fort Worth, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/985,034

(22) Filed: Dec. 30, 2015

(65) Prior Publication Data

US 2017/0194170 A1   Jul. 6, 2017

(51) Int. Cl.
*H01L 23/00* (2006.01)
*H01L 23/495* (2006.01)
(Continued)

(52) U.S. Cl.
CPC .......... *H01L 21/50* (2013.01); *H01L 23/3142* (2013.01); *H01L 23/49513* (2013.01); *H01L 23/49582* (2013.01); *H01L 24/32* (2013.01); *H01L 24/45* (2013.01); *H01L 24/48* (2013.01); *H01L 24/83* (2013.01); *H01L 24/85* (2013.01); *H01L 23/12* (2013.01); *H01L 23/13* (2013.01); *H01L 23/14* (2013.01); *H01L 23/15* (2013.01); *H01L 23/3107* (2013.01); *H01L 23/49548* (2013.01); *H01L 24/29* (2013.01); *H01L 24/97* (2013.01); *H01L 25/0657* (2013.01); *H01L 2021/60277* (2013.01); *H01L 2224/296* (2013.01); *H01L 2224/2919* (2013.01); *H01L 2224/29116* (2013.01); *H01L 2224/32245* (2013.01); *H01L 2224/45116* (2013.01); *H01L 2224/45616* (2013.01);
(Continued)

(58) Field of Classification Search
CPC ............... H01L 21/50; H01L 23/49513; H01L 23/4952; H01L 23/49537; H01L 24/85; H01L 2021/60277; H01L 23/3142; H01L 23/28; H01L 24/49; H01L 25/0657; H01L 24/97

See application file for complete search history.

(56) References Cited

U.S. PATENT DOCUMENTS 5,122,860 A * 6/1992 Kikuchi ............... B42D 25/373
257/679
5,817,544 A * 10/1998 Parthasarathi .......... H01L 23/10
438/123
(Continued)

*Primary Examiner* — Mohsen Ahmadi
(74) *Attorney, Agent, or Firm* — Dawn Jos; Charles A. Brill; Frank D. Cimino

(57) ABSTRACT

A method includes applying a die attach material to a die pad of an integrated circuit package. The die attach material is employed as a bonding material to the die pad. The method includes mounting an integrated circuit die to the die pad of the integrated circuit via the die attach material. The method includes printing an adhesion deposition material on the die attach material appearing at the interface of the integrated circuit die and the die pad of the integrated circuit package to mitigate delamination between the integrated circuit die and the die pad.

17 Claims, 4 Drawing Sheets

(51) Int. Cl.
  *H01L 23/31*   (2006.01)
  *H01L 25/065*  (2006.01)
  *H01L 23/13*   (2006.01)
  *H01L 23/12*   (2006.01)
  *H01L 23/15*   (2006.01)
  *H01L 23/14*   (2006.01)
  *H01L 21/50*   (2006.01)
  *H01L 21/60*   (2006.01)

(52) U.S. Cl.
  CPC ........... *H01L 2224/48091* (2013.01); *H01L 2224/48247* (2013.01); *H01L 2224/48816* (2013.01); *H01L 2224/48996* (2013.01); *H01L 2224/49171* (2013.01); *H01L 2224/73265* (2013.01); *H01L 2224/80856* (2013.01); *H01L 2224/8392* (2013.01); *H01L 2224/83192* (2013.01); *H01L 2224/83951* (2013.01); *H01L 2224/8502* (2013.01); *H01L 2224/85051* (2013.01); *H01L 2224/92247* (2013.01); *H01L 2924/00014* (2013.01); *H01L 2924/14* (2013.01); *H01L 2924/181* (2013.01); *H01L 2924/3511* (2013.01); *H01L 2924/35121* (2013.01)

(56) References Cited

U.S. PATENT DOCUMENTS

| | | | | |
|---|---|---|---|---|
| 6,452,255 | B1* | 9/2002 | Bayan | H01L 23/3107 257/666 |
| 7,224,070 | B2* | 5/2007 | Yang | H01L 24/83 257/777 |
| 7,227,245 | B1* | 6/2007 | Bayan | H01L 23/49503 257/666 |
| 7,327,017 | B2* | 2/2008 | Sirinorakul | H01L 21/4835 257/666 |
| 7,427,813 | B1* | 9/2008 | Wang | H01L 23/3142 257/643 |
| 9,496,171 | B2* | 11/2016 | Cook | H01L 21/4867 |
| 9,524,926 | B2* | 12/2016 | Cook | H01L 24/92 |
| 9,646,906 | B2* | 5/2017 | Cook | H01L 21/288 |
| 9,780,017 | B2* | 10/2017 | Cook | H01L 23/4952 |
| 9,865,554 | B2* | 1/2018 | Shim | H01L 24/03 |
| 2002/0041019 | A1* | 4/2002 | Gang | H01L 21/566 257/678 |
| 2004/0038471 | A1* | 2/2004 | Sakamoto | H01L 21/4828 438/200 |
| 2006/0121647 | A1 | 6/2006 | Lin et al. | |
| 2007/0114640 | A1* | 5/2007 | Kosowsky | H01L 23/60 257/666 |
| 2007/0205518 | A1* | 9/2007 | Bauer | B82Y 10/00 257/777 |
| 2009/0026594 | A1* | 1/2009 | Yee | H01L 21/4821 257/676 |
| 2009/0065912 | A1* | 3/2009 | Riedl | C25D 3/56 257/666 |
| 2009/0146268 | A1* | 6/2009 | Huang | H01L 21/6835 257/659 |
| 2009/0283897 | A1* | 11/2009 | Fukaya | H01L 23/3107 257/696 |
| 2009/0309201 | A1* | 12/2009 | Morita | H01L 23/49503 257/676 |
| 2011/0042125 | A1* | 2/2011 | Lee | C23C 18/08 174/250 |
| 2011/0111563 | A1* | 5/2011 | Yanagi | H01L 21/561 438/118 |
| 2012/0211889 | A1* | 8/2012 | Edwards | H01L 21/4821 257/746 |
| 2012/0212536 | A1* | 8/2012 | Saito | C09D 11/324 347/16 |
| 2012/0252164 | A1* | 10/2012 | Nakao | H01L 21/76898 438/107 |
| 2013/0122654 | A1 | 5/2013 | Ho et al. | |
| 2013/0154110 | A1 | 6/2013 | Gowda | |
| 2013/0260511 | A1* | 10/2013 | Chen | H01L 21/56 438/118 |
| 2014/0097526 | A1* | 4/2014 | Suleiman | H01L 24/33 257/676 |
| 2014/0124939 | A1* | 5/2014 | Romig | H01L 24/24 257/773 |
| 2001/0745599 | | 6/2014 | Romig et al. | |
| 2014/0168902 | A1* | 6/2014 | Park | H01L 23/367 361/719 |
| 2014/0175599 | A1* | 6/2014 | Romig | H01L 23/29 257/528 |
| 2014/0284779 | A1* | 9/2014 | Hayata | H01L 24/48 257/676 |
| 2014/0356528 | A1* | 12/2014 | Dellea | H01L 21/67721 427/180 |
| 2015/0035202 | A1* | 2/2015 | Takeda | B29C 41/20 264/271.1 |
| 2015/0342060 | A1* | 11/2015 | Kim | H05K 3/284 264/40.7 |
| 2015/0380384 | A1* | 12/2015 | Williams | H01L 24/97 438/112 |
| 2016/0093558 | A1* | 3/2016 | Cook | H01L 24/32 257/676 |
| 2016/0152851 | A1* | 6/2016 | Zhang | B22F 1/0018 252/514 |
| 2016/0254214 | A1* | 9/2016 | Makino | H01L 24/97 257/676 |
| 2016/0254230 | A1* | 9/2016 | Lee | H01L 23/552 257/659 |
| 2017/0125881 | A1* | 5/2017 | Mangrum | H01Q 1/2283 |

\* cited by examiner

PRINTED ADHESION DEPOSITION TO MITIGATE INTEGRATED CIRCUIT PACKAGE DELAMINATION

TECHNICAL FIELD

This disclosure relates to integrated circuits, and more particularly to a printed adhesion deposition method to mitigate integrated circuit delamination.

BACKGROUND

A leaded semiconductor package can consist of various types of materials, which lead to coefficient of thermal expansion (CTE) mismatches and stress between interfaces when an integrated circuit package is exposed to a humid environment and a reflow process (e.g., peak temperature up to 260 C). If the adhesion is poor between the interfaces, package delamination can occur which translates into part failure. For instance, the metallic lead frame and die attached material surfaces are critical for adhesion to molding compound. The lead frame surface is smooth and has a surface ratio of about 1.0 to 1.1 when fabricated. Current methods of adhesion improvement include roughening the lead frame surface and coating the surface with an adhesion promoter layer. In the case of roughening the lead frame surface, the surface can be pre-plated by an electrolytic plating method and is a suitable solution to increase the adhesion between the lead frame and the molding compound but cannot help to increase the adhesion between the die attached surfaces to the molding compound. Also, an adhesion promoter can only be performed in areas where conduction is not needed as adhesion promoters are typically insulators, and they must be matched to both the lead frame, and die attach/mold compound materials making them selective at best. Despite these issues, current methods have been demonstrated in the industry and can address such issues partially but the cost added is high for roughening the lead frame and coating with the adhesion promoter selectively.

Another problem includes the stitch bond area or second bond where the wire connected to the lead finger of the integrated circuit is a critical area for a semiconductor device and prone for delamination. The current method of roughening the lead frame helps to improve the delamination at the stitch area but significantly degrades the wire bond capillary life, which increases the cost. The use of roughen lead frame is also an additional cost to the package.

SUMMARY

This disclosure relates to a printed adhesion deposition method to mitigate integrated circuit delamination. In one aspect, a method includes applying a die attach material to a die pad of an integrated circuit. The die attach material is employed as a bonding material to the die pad. The method includes mounting an integrated circuit die to the die pad of the integrated circuit via the die attach material. The method includes printing an adhesion deposition material on the die attach material appearing at the interface of the integrated circuit die and the die pad of the integrated circuit to mitigate delamination between the integrated circuit die and the die pad.

In another aspect, a method includes printing an adhesion deposition material along a perimeter of a wire mounting area on a lead finger of an integrated circuit. The adhesion deposition material is employed to mitigate contaminants from entering the wire mounting area of the lead finger. The method includes bonding an end of a conductor to a connection point on an integrated circuit die. The method includes bonding another end of the conductor to the wire mounting area on the lead finger of the integrated circuit within the perimeter defined by the adhesion deposition material.

In yet another aspect, an integrated circuit includes a die pad of the integrated circuit. An integrated circuit die is mounted to the die pad of the integrated circuit. The integrated circuit die has a circuit connection point. A first adhesion deposition material is printed along the perimeter of the interface of the integrated circuit die and the die pad of the integrated circuit to mitigate delamination between the integrated circuit die and the die pad. A lead finger on the integrated circuit provides external circuit connections to the integrated circuit die. A second adhesion deposition material is printed along a perimeter of a wire mounting area on the lead finger of the integrated circuit. The second adhesion deposition material employed to mitigate contaminants from entering the wire mounting area of the lead finger. The integrated circuit includes a conductor having a first end bonded to the circuit connection point of the integrated circuit die and a second end bonded to the wire mounting area on the lead finger of the integrated circuit. The second end of the conductor bonded within the perimeter defined by the second adhesion deposition material.

DETAILED DESCRIPTION

This disclosure relates to a printed adhesion deposition method to mitigate delamination. Various areas of an integrated circuit package can have a printed deposition material applied via an economical printing process such a via an ink jet printer. The printed deposition material can include metal (or metal alloy) nano or micro-particles, where the deposition material mitigates delamination from occurring within the integrated circuit package such as at or near the interface between an integrated circuit die and the die pad where the integrated circuit die is mounted. Multi-stage manufacturing methods can be provided that includes applying a die attach material to a die pad of the integrated circuit package. The die attach material (e.g., epoxy) is employed as a bonding material to the die pad. This includes mounting the integrated circuit die to the die pad of the integrated circuit via the die attach material. The method then includes printing the adhesion deposition material on the die attach material appearing at the interface of the integrated circuit die and the die pad of the integrated circuit to mitigate delamination between the integrated circuit die and the die pad.

In another aspect, the printed deposition material can be applied to the lead finger area of the integrated circuit package. By applying the printed deposition material to the lead finger area, an isolation barrier can be constructed that mitigates contaminants from entering the lead finger area of the integrated circuit package. By utilizing the printed deposition material on both the die pad interface and the lead finger areas of the integrated circuit package, quality can be improved since delamination is mitigated at the die pad interface and contaminants are reduced from entering the lead finger areas.

Figure 1A:
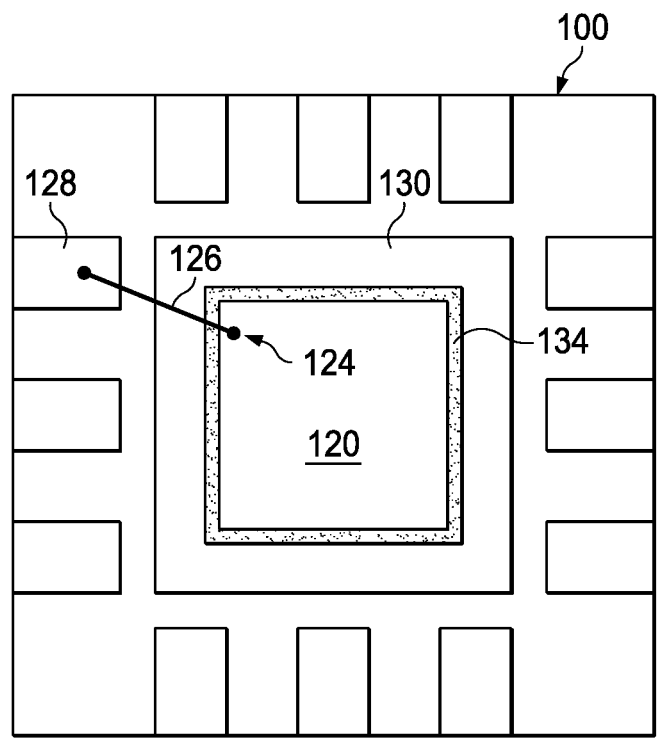
FIGS. 1A and 1B illustrate an example of integrated circuit packages that employ a printed adhesion deposition material to mitigate integrated circuit package delamination.
Figure 1B:
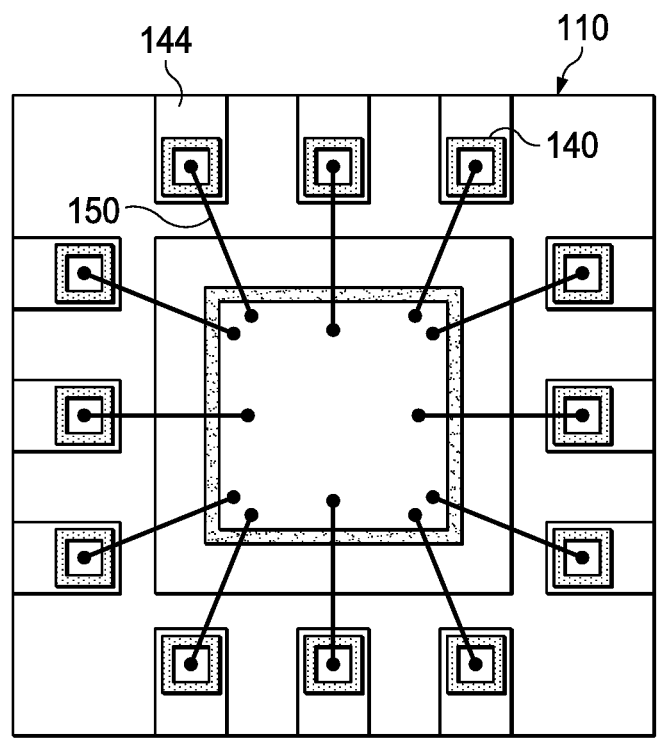

FIGS. 1A and 1B illustrate an example of integrated circuit packages 100 and 110 that employ a printed adhesion deposition material to mitigate delamination. As used herein, the term circuit can include a collection of active and/or passive elements that perform a circuit function such as an analog circuit or control circuit, for example. The term circuit can also include an integrated circuit where all the circuit elements are fabricated on a common substrate, for example. An integrated circuit die 120 is mounted to a die pad (See e.g., of FIG. 2A for die pad) of the integrated circuit 100. The integrated circuit die 120 can be an analog circuit, digital circuit, or a combination of analog and digital. The integrated circuit die 120 has at least one circuit connection point shown at 124 that can connect via wire 126 to lead finger are 128. An adhesion deposition material (also referred to as first material) 130 is printed along the perimeter of the interface of the integrated circuit die 120 and the die pad of the integrated circuit to mitigate delamination between the integrated circuit die and the die pad. The adhesion deposition material 130 can cover a bonding material 134 that adheres the integrated circuit die 120 to the die pad. The lead finger 128 on the integrated circuit package 100 provides external circuit connections to the integrated circuit die 120.

Referring to FIG. 1B and the circuit 110, a second adhesion deposition material such as shown at 140 can be printed along a perimeter of a wire mounting area on a lead finger 144 of the integrated circuit 110. As shown, each lead finger of the circuit 100 can have an area of printed deposition material to mitigate contamination at each area. Also, although not shown, integrated circuit packages can be manufactured where both the lead finger areas and the integrated circuit die mounting are is coated with the printed deposition material as shown at 130 and 134. The second adhesion deposition material 140 is employed to mitigate contaminants from entering the wire mounting area of the lead finger 144 (or other lead fingers). The integrated circuit 110 includes a conductor such as shown at 150 having a first end bonded to the circuit connection point of the integrated circuit die and a second end bonded to the wire mounting area on the lead finger of the integrated circuit. The second end of the conductor can be bonded within the perimeter defined by the second adhesion deposition material 140. Although rectangular patterns are shown for the printed deposition areas at 130 and 140, substantially any type of pattern can be employed including circular patterns, square patterns, trapezoidal patterns, and so forth depending on the shapes of the lead fingers and or die pad areas, respectively. FIGS. 2A-2D and 3A-3E will now be illustrated and described below that show respective manufacturing processes to apply the printed deposition material to the respective areas for the integrated circuit packages 100 and/or 110.

Figure 2A:
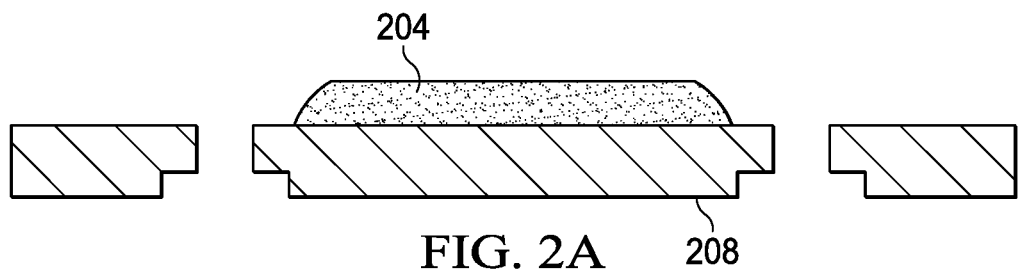
FIGS. 2A through 2D illustrate an example of a printed adhesion deposition manufacturing process applied to a die attach region of an integrated circuit package to mitigate delamination.
Figure 2B:
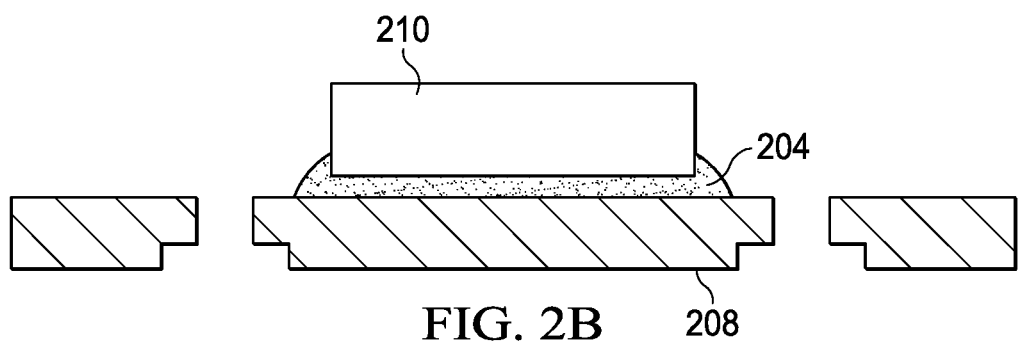
Figure 2C:
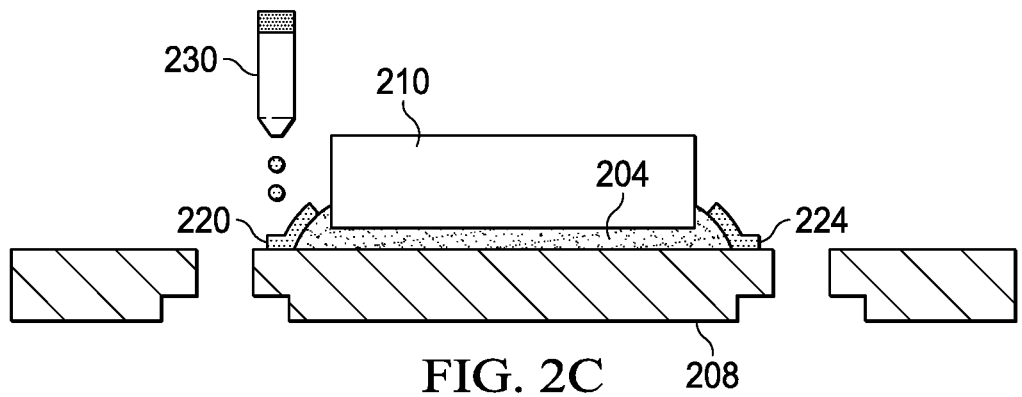
Figure 2D:
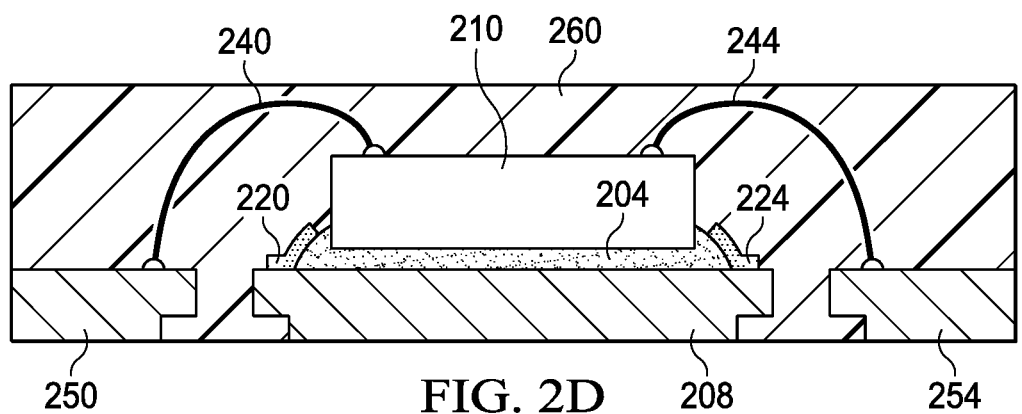

FIGS. 2A through 2D illustrate an example of a printed adhesion deposition manufacturing process applied to a die attach region of an integrated circuit to mitigate delamination. FIG. 2A shows applying a die attach material 204 such as an epoxy to a die pad 208 of an integrated circuit package. The die attach material is employed as a bonding material to the die pad 208. FIG. 2B of the manufacturing process includes mounting an integrated circuit die 210 to the die pad 208 of the integrated circuit package via the die attach material 204. FIG. 2C of the manufacturing process includes printing an adhesion deposition material such as shown at 220 and 224 via printer 230 on the die attach material appearing at the interface of the integrated circuit die 210 and the die pad 208 of the integrated circuit package to mitigate delamination between the integrated circuit die and the die pad. As will be described below with respect to the methods of FIGS. 4 and 5, heating can be applied after the printing. FIG. 2D shows a combined process where wires 240 and 244 are first attached between the die 210 and lead fingers 250 and 254. After the wires are bonded, integrated circuit package molding 260 can be applied.

Figure 3A:
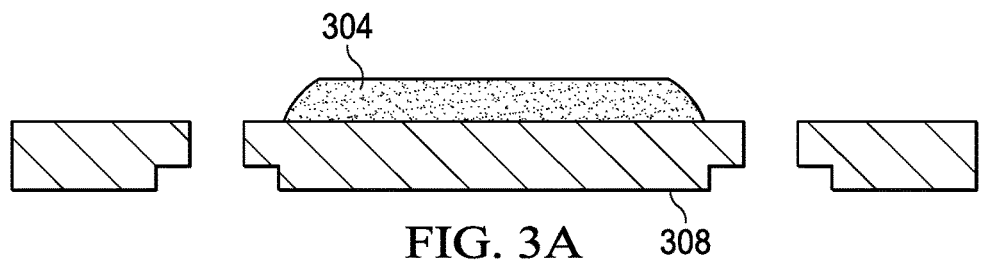
FIGS. 3A through 3E illustrate an example of a printed adhesion deposition manufacturing process applied to a lead finger region of an integrated circuit package to mitigate delamination.
Figure 3B:
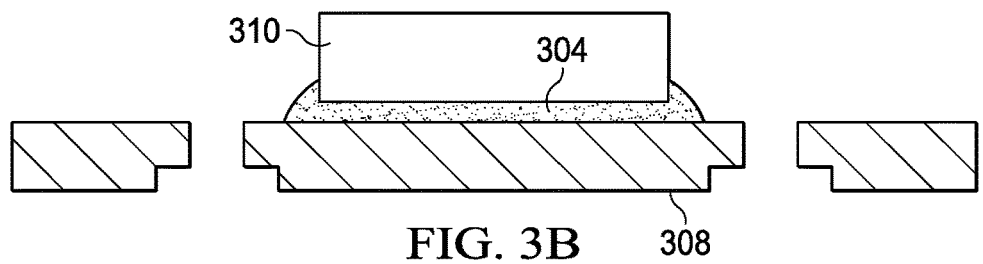
Figure 3C:
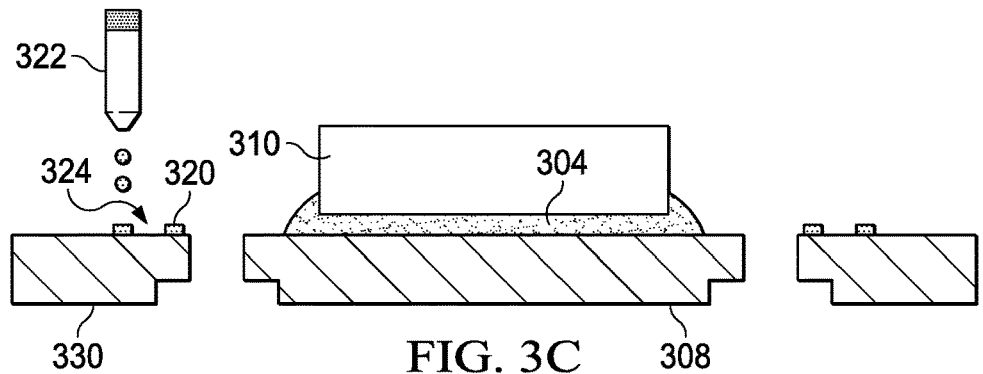
Figure 3D:
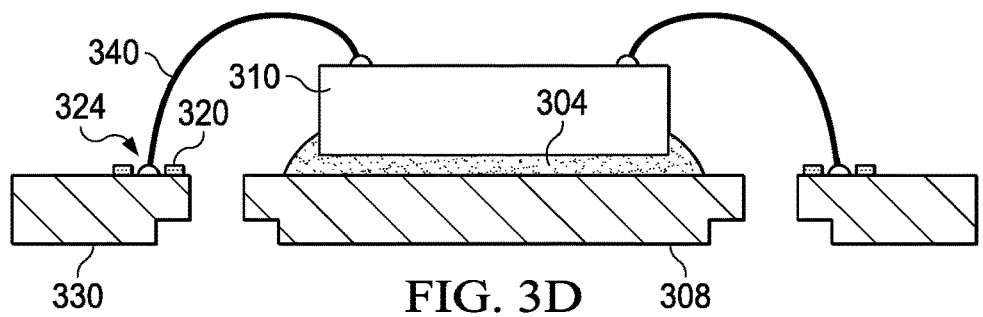
Figure 3E:
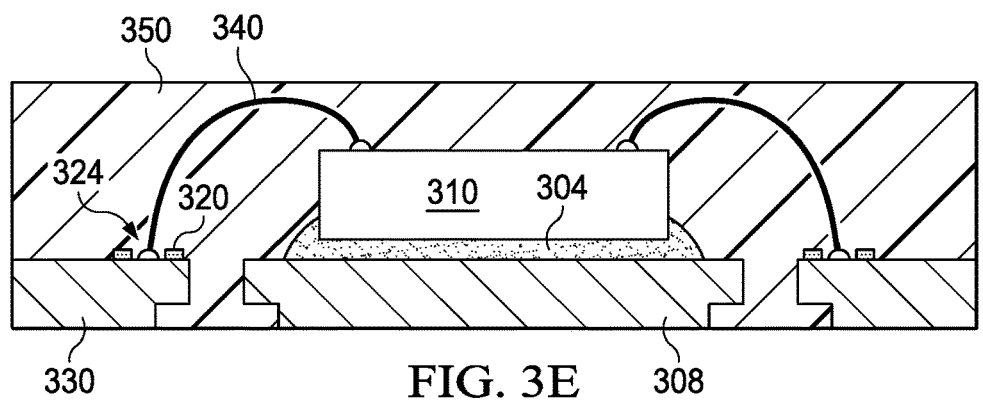

FIGS. 3A through 3E illustrate an example of a printed adhesion deposition manufacturing process applied to a lead finger region of an integrated circuit package to mitigate delamination. FIG. 3A shows applying a die attach material 304 such as an epoxy to a die pad 308 of an integrated circuit package. The die attach material is employed as a bonding material to the die pad 308. FIG. 3B of the manufacturing process includes mounting an integrated circuit die 310 to the die pad 308 of the integrated circuit package via the die attach material 304. An adhesion deposition material 320 is printed via printer 322 along a perimeter of a wire mounting area 324 on a lead finger 330 of an integrated circuit package. The adhesion deposition material is employed to mitigate contaminants and the prorogation of delamination from entering the wire mounting area of the lead finger. FIG. 3D shows bonding an end of a conductor 340 to a connection point on an integrated circuit die 310 and bonding another end of the conductor 340 to the wire mounting area 324 on the lead finger 330 of the integrated circuit package within the perimeter defined by the adhesion deposition material. FIG. 3E shows the additional process of applying a molding material 350 to encapsulate the integrated circuit.

Figure 4:
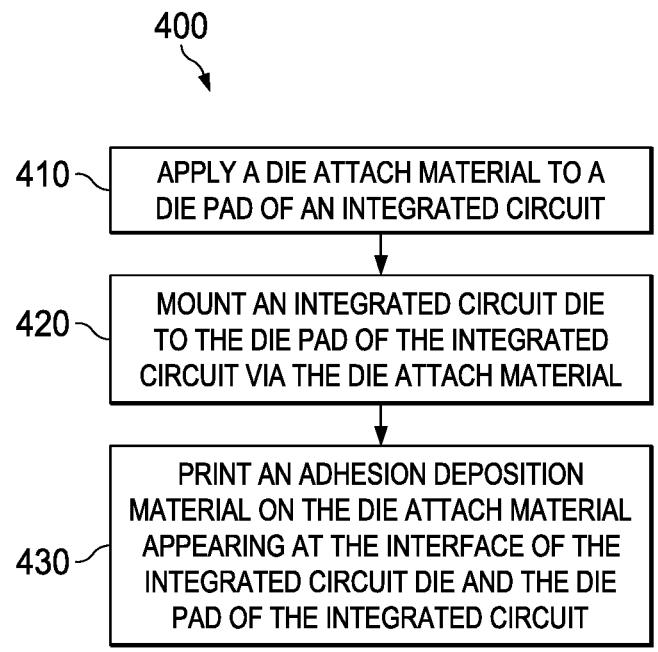
FIG. 4 illustrates an example of a printed adhesion deposition method for a die attach region of an integrated circuit package to mitigate delamination.
Figure 5:
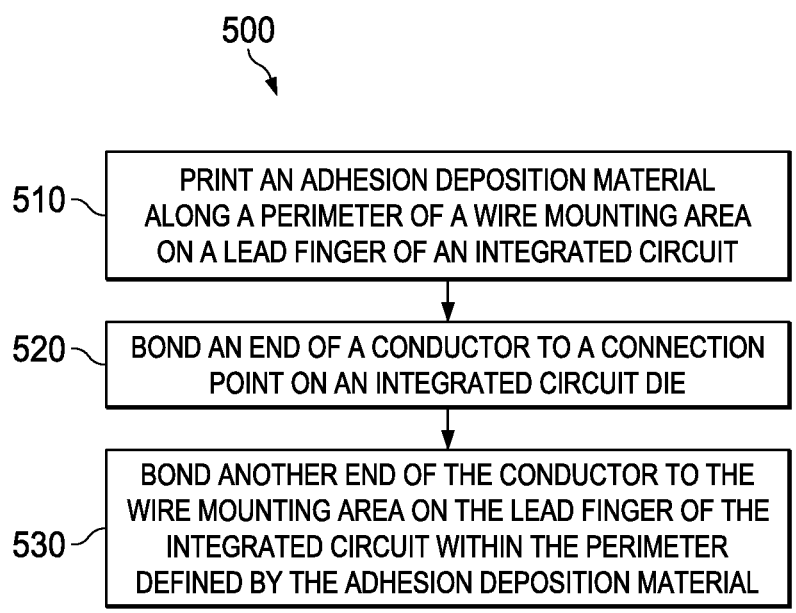
FIG. 5 illustrates an example of a printed adhesion perimeter method for a lead finger region of an integrated circuit package to mitigate delamination.

In view of the foregoing structural and functional features described above, an example method will be better appreciated with reference to FIGS. 4 and 5. While, for purposes of simplicity of explanation, the methods are shown and described as executing serially, it is to be understood and appreciated that the methods are not limited by the illustrated order, as parts of the methods could occur in different orders and/or concurrently from that shown and described herein. Such methods can be executed to manufacture and integrated circuit package, for example.

FIG. 4 illustrates an example of a printed adhesion deposition method 400 for a die attach region of an integrated circuit package to mitigate delamination. At 410, the method 400 includes applying a die attach material to a die pad of an integrated circuit (See e.g., FIG. 2A). The die attach material is employed as a bonding material to the die pad. At 420, the method 400 includes mounting an integrated circuit die to the die pad of the integrated circuit package via the die attach material (See e.g., FIG. 2B). At 430, the method 400 includes printing an adhesion deposition material on the die attach material appearing at the interface of the integrated circuit die and the die pad of the integrated circuit package to mitigate delamination between the integrated circuit die and the die pad (See e.g., FIG. 2C).

Although not shown, the method 400 can also include printing the adhesion deposition material via an inkjet printer, a screen printer, or a flexographic printer, for example. The adhesion deposition material can include a metallic particle material that includes nano-particle ink or micro-particle ink, for example. The metallic particle material facilitates an increase of chemical and/or mechanical adhesion at the interface via roughness and/or molecular/atomic forces. The metallic particle material can include a metal and/or a metal alloy. The method 400 can also include heating the adhesion deposition material during or after the printing of the adhesion deposition material. The heating can be applied via laser, flash lamp, infrared, or plasma, microwave, for example. The heating can be in the range of about 80 degrees Celsius to about 200 degrees Celsius, for example. The method 400 can also include bonding at least one wire between the integrated circuit die and a lead finger that provides external connections to the integrated circuit. This includes applying a molding material to the integrated circuit to encapsulate the integrated circuit.

FIG. 5 illustrates an example of a printed adhesion perimeter method 500 for a lead finger region of an integrated circuit package to mitigate delamination. At 510, the method 500 includes printing an adhesion deposition material along a perimeter of a wire mounting area on a lead finger of an integrated circuit package (See e.g., FIG. 3C). The adhesion deposition material is employed to mitigate contaminants from entering the wire mounting area of the lead finger. At 520, the method 500 includes bonding an end of a conductor to a connection point on an integrated circuit die (See e.g., FIG. 3D). At 530, the method 500 includes bonding another end of the conductor to the wire mounting area on the lead finger of the integrated circuit package within the perimeter defined by the adhesion deposition material (See e.g., FIG. 3D).

Although not shown, the method 500 can also include printing the adhesion deposition material via an inkjet printer, a screen printer, or a flexographic printer, for example. The adhesion deposition material includes a metallic particle material that includes nano-particle ink or micro-particle ink, for example. The metallic particle material includes a metal or a metal alloy. The method 500 can also include heating the adhesion deposition material during or after the printing of the adhesion deposition material. Similar to the method 400, the method 500 can include heating in the range of about 80 degrees Celsius to about 200 degrees Celsius. The method 500 can also include applying a molding material to the integrated circuit to encapsulate the integrated circuit.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit (IC) package comprising:
   a lead frame including a die attach pad;
   a die attach material on the die attach pad;
   an IC die on the die attach material;
   an adhesion material on a first set of portions of the die attach pad and the die attach material, wherein the adhesion material does not contact the IC die, and wherein the adhesion material does not contact a top portion of the die attach pad under the IC die, in a cross-sectional view of the IC package; and
   a mold compound covering a second set of portions of the die attach material and the die attach pad, and portions of the IC die and the adhesion material.

2. The IC package of claim 1, wherein the lead frame includes a set of lead fingers electrically connected to the IC die.

3. The IC package of claim 1, wherein the adhesion material is a printed adhesion material.

4. The IC package of claim 3, wherein the printed adhesion material is printed from an inkjet printer.

5. The IC package of claim 1, wherein the adhesion material includes one of a metal and a metal alloy.

6. The IC package of claim 1, wherein the adhesion material is a particle ink.

7. The IC package of claim 1, wherein the adhesion material is printed from one of a screen printer and a flexographic printer.

8. The IC package of claim 1, wherein surfaces of adhesion material has a mechanical adhesion with the mold compound.

9. The IC package of claim 1, wherein the adhesion material is heated during or after the printing of the adhesion material.

10. The IC package of claim 9, wherein the adhesion material is heated at a range of 80 degrees Celsius to 200 degrees Celsius.

11. The IC package of claim 1, wherein the adhesion material includes a topmost surface below a level of a top surface of the IC die such that the adhesion material does not cover the top surface of the IC die.

12. The IC package of claim 1, wherein the adhesion material contacts a bottom side of the die attach material, and covers more than half of the area of the die attach material between the IC die and the die attach pad.

13. An integrated circuit (IC) package comprising:
    a lead frame including a die attach pad;
    a die attach material on the die attach pad;
    an IC die on the die attach material;
    an adhesion material on a first set of portions of the die attach pad, and the die attach material, wherein the adhesion material is a printed adhesion material, wherein the adhesion material does not contact the IC die, and wherein the adhesion material does not contact a top portion of the die attach pad under the IC die; and
    a mold compound covering a second set of portions of the die attach material and the IC die, portions of the die attach pad, and portions of the adhesion material.

14. The IC package of claim 13, wherein the adhesion material is a particle ink.

15. The IC package of claim 13, wherein the adhesion material includes a topmost surface below a level of a top surface of the IC die such that the adhesion material does not cover the top surface of the IC die.

16. The IC package of claim 13, wherein the adhesion material contacts a bottom side of the die attach material, and covers more than half of the area of the die attach material between the IC die and the die attach pad.

17. The IC package of claim 13, wherein the adhesion material does not contact the die attach pad under the IC die, in a cross-sectional view of the IC package.

* * * * *